(12) United States Patent
Nishimura et al.

(10) Patent No.: US 7,387,952 B2
(45) Date of Patent: Jun. 17, 2008

(54) SEMICONDUCTOR SUBSTRATE FOR SOLID-STATE IMAGE PICKUP DEVICE AND PRODUCING METHOD THEREFOR

(75) Inventors: Shigeru Nishimura, Ebina (JP); Seiichi Tamura, Yokohama (JP); Hiroshi Yuzurihara, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/291,955

(22) Filed: Dec. 2, 2005

(65) Prior Publication Data

US 2006/0124929 A1   Jun. 15, 2006

(30) Foreign Application Priority Data

Dec. 10, 2004   (JP) ............................. 2004-358343

(51) Int. Cl.
*H01L 21/322* (2006.01)

(52) U.S. Cl. .................. 438/471; 257/53; 257/414; 257/428; 438/48; 438/49; 438/57; 438/58

(58) Field of Classification Search ............ 257/49, 257/52, 53, 414, 428, 913; 438/414, 48, 438/49, 57, 58, 471
See application file for complete search history.

(56) References Cited

U.S. PATENT DOCUMENTS

| | | | | |
|---|---|---|---|---|
| 4,376,657 A | * | 3/1983 | Nagasawa et al. .......... 438/402 |
| 4,608,095 A | * | 8/1986 | Hill ............................ 148/33 |
| 4,851,358 A | * | 7/1989 | Huber ........................ 438/471 |
| 5,245,201 A | * | 9/1993 | Kozuka et al. ............. 257/53 |
| 5,327,007 A | * | 7/1994 | Imura et al. ............... 257/610 |
| 5,419,786 A | * | 5/1995 | Kokawa et al. ............ 148/33.5 |
| 5,506,154 A | * | 4/1996 | Kawahara et al. .......... 438/471 |
| 5,534,069 A | | 7/1996 | Kuwabara et al. .......... 118/719 |
| 5,541,454 A | | 7/1996 | Inoue et al. ................. 257/767 |
| 5,939,770 A | * | 8/1999 | Kageyama .................. 257/611 |
| 6,156,657 A | | 12/2000 | Kuwabara et al. .......... 438/688 |
| 6,544,656 B1 | * | 4/2003 | Abe et al. .................. 428/446 |
| 7,081,422 B2 | * | 7/2006 | Hayamizu et al. ......... 438/795 |
| 2005/0056905 A1 | | 3/2005 | Kuwabara et al. .......... 257/446 |

FOREIGN PATENT DOCUMENTS

| | | |
|---|---|---|
| JP | 7-22429 | 1/1995 |
| JP | 8-45944 | 2/1996 |
| JP | 8-104592 | 4/1996 |
| JP | 11-21200 | 1/1999 |
| JP | 11-103042 | 4/1999 |

* cited by examiner

*Primary Examiner*—Jerome Jackson
*Assistant Examiner*—Anthony Ho
(74) *Attorney, Agent, or Firm*—Fitzpatrick, Cella, Harper & Scinto

(57) ABSTRACT

A semiconductor substrate for forming a pixel area provided surfacially with a plurality of pixels for photoelectric conversion, the semiconductor substrate, including a polysilicon film of a thickness of 0.5-2.0, on a rear surface of the pixel area-bearing surface, and having an oxygen concentration of 1.3-1.5E+18 atom/cm$^3$ (old ASTM).

3 Claims, 4 Drawing Sheets

SEMICONDUCTOR SUBSTRATE FOR SOLID-STATE IMAGE PICKUP DEVICE AND PRODUCING METHOD THEREFOR

This application claims priority from Japanese Patent Application No. 2004-358343, filed on Dec. 10, 2004, which is hereby incorporated by reference herein.

BACKGROUND OF THE INVENTION

1. Field of the Invention

The present invention relates to a gettering substrate for reducing a pixel defect generated by a heavy metal impurity in a solid-state image pickup device such as a CMOS image pickup device, a semiconductor substrate for a solid-state image pickup device, and a producing method therefor.

2. Related Background Art

It is already known that, in a semiconductor device manufacturing process, characteristics of the device are deteriorated when a crystalline defect, generated by a contamination by a heavy metal such as Fe, Ni, Cr etc. present in a semiconductor substrate, is formed on a surface of the semiconductor substrate on which a device is to be formed.

In particular, in a CMOS image pickup device, a crystalline defect generated in a photoelectric converting device generates a weak current in a dark state, causing a white dot defect in the image pickup device.

For reducing such white dot defect, there has been employed an IG (intrinsic gettering) method or a PBS (polysilicon back seal) method.

The IG method is described for example in Japanese Patent Application Laid-open No. H11-021200, and the PBS is described for example in Japanese Patent Application Laid-open No. H07-022429 (corresponding to U.S. Pat. No. 5,419,786).

Also in order to avoid a drawback of excessive BMD (bulk micro defect) generation in the PBS method, Japanese Patent Application Laid-open No. H08-045944 describes a temperature defining prior to a polysilicon film formation on the rear surface, and Japanese Patent Application Laid-open Nos. H08-104592 and H11-103042 describe that an impurity introduction leads to a dark current generation and a white dot defect in the semiconductor image pickup apparatus.

It is also known that an output of the white dot defect in the image pickup apparatus depends on a type of heavy metal constituting the cause thereof.

For gettering of such various heavy metals, the IG method and the PBS method are useful.

However, a single gettering technology is insufficient for achieving a gettering effect for plural heavy metals.

This is because each heavy metal has a matching gettering technology. FIG. 5 briefly shows an example.

It is shown that the PBS method is more effective than the IG method for a certain output, and the IG method is more effective for other output.

Therefore, for reducing the number of white dot defects thereby improving the image obtained by the image pickup apparatus, there is desired a gettering technology effective for various heavy metals constituting the cause of such defects.

SUMMARY OF THE INVENTION

The above-mentioned objective can be attained, according to the present invention, by a semiconductor substrate for forming a pixel area provided at a surface thereof with a plurality of pixels for photoelectric conversion, the semiconductor substrate including, on a rear surface of the pixel area-bearing surface, a polysilicon film of a thickness T within a range of $0.5 \leq T \leq 2.0$ μm, and the semiconductor substrate having an oxygen concentration D within a range of $1.3E18 \leq D \leq 1.5E18$ atom/cm$^3$ (old ASTM).

The present invention also provides a semiconductor substrate for forming a pixel area provided at a surface thereof with a plurality of pixels for photoelectric conversion, the semiconductor substrate including, on a rear surface of the pixel area-bearing surface, a polysilicon film of a thickness T within a range of $0.5 \leq T \leq 2.0$ μm, also including a non-defective area in a part of the semiconductor substrate, and having a bulk micro defect density of 1E5/cm$^2$ or higher in the semiconductor substrate.

The present invention further provides a producing method for a semiconductor substrate for forming a pixel area provided at a surface thereof with a plurality of pixels for photoelectric conversion, the method including a step of forming a polysilicon film of a thickness T within a range of $0.5 \leq T \leq 2.0$ μm on a rear surface of the pixel area-bearing surface, and a step of obtaining an oxygen concentration D within a range of $1.3E18 \leq D \leq 1.5E18$ atom/cm$^3$ (old ASTM) by a thermal process in the semiconductor substrate, and further including a step of executing a thermal process for 1 hour or longer at a temperature H within a range of $450 \leq H \leq 750°$ C. prior to a step of forming a wiring on the semiconductor substrate.

The present invention further provides a producing method for a semiconductor substrate for forming a pixel portion provided at a surface thereof with a plurality of pixels for photoelectric conversion, the method including a step of forming a polysilicon film of a thickness T within a range of $0.5 \leq T \leq 2.0$ μm on a rear surface of the pixel area-bearing surface, a step of forming a non-defective area in a part of the semiconductor substrate, and a step of realizing a bulk micro defect density of 1E5/cm$^2$ or higher in the semiconductor substrate, and further including a step of executing a thermal process for 1 hour or longer at a temperature H within a range of $450 \leq H \leq 750°$ C. prior to a step of forming a wiring on the semiconductor substrate.

Other features and advantages of the present invention will become apparent from the following description taken in conjunction with the accompanying drawings, in which like reference characters designate the same or similar parts throughout the figures thereof.

The accompanying drawings, which are incorporated in and constitutes a part of the specification, illustrate embodiments of the invention and, together with the description, serve to explain the principles of the invention.

DETAILED DESCRIPTION OF THE PREFERRED EMBODIMENTS

The present inventors have noticed a relation between a type of heavy metal inducing a white dot defect in the solid-state image pickup device and an optimum gettering technology for reducing each heavy metal. More specifically, in a configuration having a PBS on a rear surface of the semiconductor substrate opposite to a surface thereof on which a light receiving portion is to be formed, at least either of an oxygen concentration and a BMD in the substrate is controlled in a range so as to reduce a white dot defect to a level substantially not causing a problem in the characteristics of the image pickup device.

For the oxygen concentration in the semiconductor substrate with PBS, a concentration sufficient for a spontaneous BMD formation in the thermal process is defined as a lower limit, and a concentration for preventing remaining defects is defined as an upper limit.

Such limit definitions allows the white dot defects to remain within a range not constituting a problem in the solid-state image pickup device.

Also for the BMD density in the semiconductor substrate with PBS, a lower limit is so selected as to advantageously capture heavy metals.

Preparation of a substrate equipped with such two gettering layers can be realized as follows.

A PBS formation on a semiconductor substrate developed by a CZ method involves a thermal process at 550-650° C., which tends to develop BMD.

Thus BMD remains on the substrate surface on which a device is to be formed, thereby resulting in drawbacks such as white dot defect.

For avoiding such drawbacks, it is commonly executed to lower the oxygen concentration in the substrate, constituting the cause for BMD, or to apply an appropriate thermal process prior to the PBS formation thereby setting BMD in the substrate at $1E+5/cm^2$ or less even in a PBS substrate.

In contrast, the present inventors having found to provide the substrate with a non-defective area (denuded zone) by an IG method prior to PBS formation, also to positively form BMD in the substrate and to thereafter form PBS.

In this manner there can be realized preparation of a semiconductor substrate in which surface defects do not remain by the PBS and which effectively reduces the white dot damage in the image pickup device.

Also it is furthermore effective, as described in the foregoing, to apply, to such substrate, a final low-temperature thermal processing at 450-750° C. for 1 hour or longer prior to a step of forming a wiring.

In the following, the present invention will be clarified further by embodiments thereof.

First Embodiment

Figure 1:
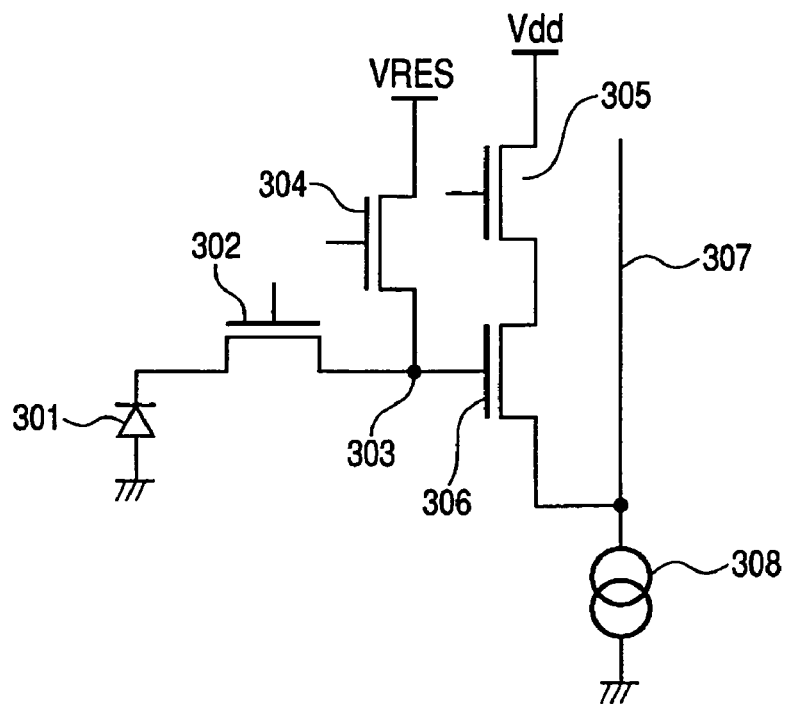
FIG. 1 is an equivalent circuit diagram of a semiconductor image pickup apparatus in a first embodiment of the present invention.

FIG. 1 is an equivalent circuit diagram of a solid-state image pickup device of the present embodiment.

The present embodiment will be explained by so-called CMOS image pickup device having an amplifying element in a light-receiving portion.

There are provided a photodiode (PD) 301, a transfer MOS transistor 302 for transferring a signal charge generated in the PD, a floating diffusion area (FD) 303 for temporarily storing the transferred signal charge, a resetting MOS transistor 304 for resetting the FD 303, a selecting MOS transistor 305 for selecting an arbitrary row in an array, a source follower MOS transistor 306 for converting the signal charge of the FD 3 into a voltage and amplifying it, a signal readout line 307 for reading a pixel voltage signal commonly for a row, and a constant current source 308.

However the configuration of a pixel is not limited to the foregoing, and thereby may also be adopted a configuration in which the transfer MOS transistor is omitted, a configuration in which the selecting MOS transistor is omitted, or a configuration sharing a specified MOS transistor for a pixel.

Figure 2:
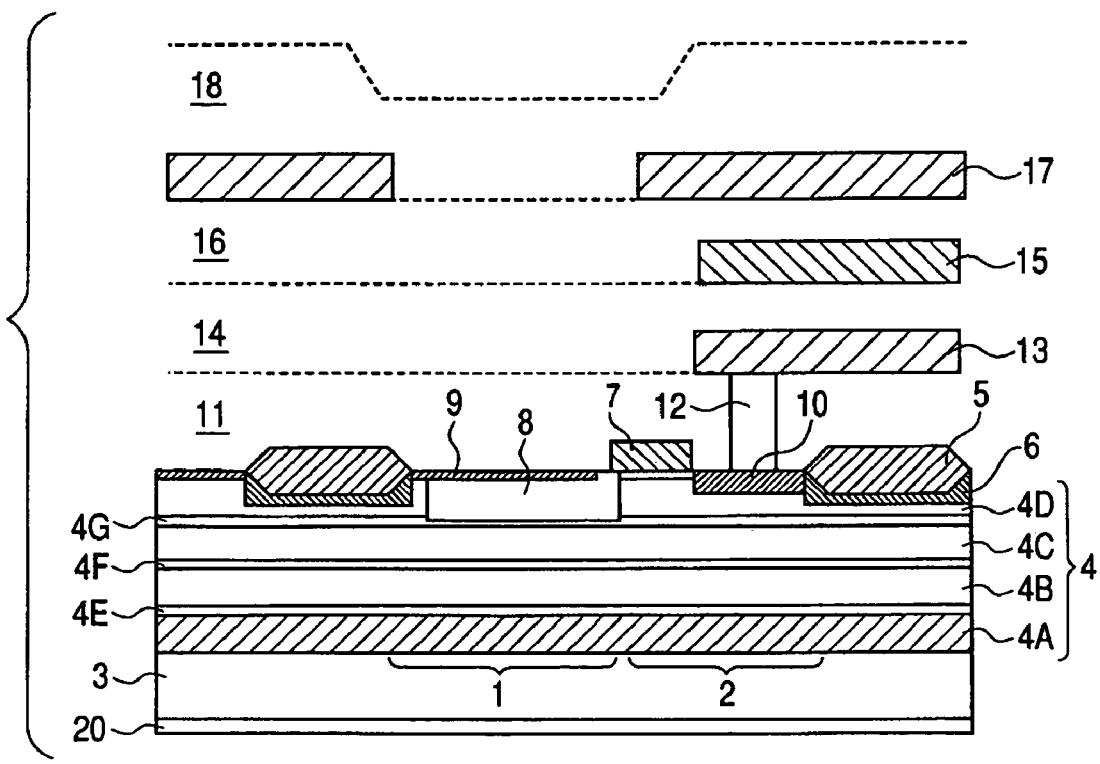
FIG. 2 is a cross sectional view of a pixel portion in the first embodiment of the present invention.

FIG. 2 is a cross-sectional view of a pixel portion of the present embodiment, illustrating a photodiode portion 1 and a transfer MOS transistor portion 2.

There are shown an n-type silicon substrate 3, and a P-type well 4 formed by plural layers, having a 4-layered structure with layers 4A-4D in the present embodiment.

Between the layers 4A-4D of the well, N-type semiconductor layers 4E-4G are provided.

There are also shown a gate electrode 7 of the transfer MOS transistor, an N-type charge accumulation area 8 of the photodiode, a surface P-type area 9 (constituting a surface charge recombination area) for obtaining PD of an embedded structure, a field oxide film 5 for device isolation, and an N-type high concentration area 10 constituting the FD to which a charge is transferred from the N-type charge accumulation area 8.

There are further shown a silicon oxide film 11 for insulating the gate electrode and a first metal layer, a contact plug 12, a first metal layer 13, an interlayer insulation film 14 for insulating the first metal layer and a second metal layer, a second metal layer 15, an interlayer insulation film 16 for insulating the second metal layer and a third metal layer, a third metal layer 17, and a passivation film 18.

On the passivation film 18, there are formed a color filter layer and a microlens for sensitivity increase, which are not illustrated.

In the present embodiment, the wiring layer has a three-layered structure, but the wiring layer of one- or two-layered structure, for securing the optical characteristics according the specification of the sensor, is not against the principle of the present invention.

A reduction of the white dot defect in the semiconductor image pickup apparatus can be achieved by a metal gettering on a gettering site to induce a redistribution of a metal impurity in the direction of depth, thereby eliminating the metal from the N-type charge accumulation area 8 of the depleted PD.

In the following, a producing process will be explained with reference to a cross-sectional view shown in FIG. 2.

At first an n-substrate (100) is prepared.

A polysilicon 20 constituting PBS is formed on the rear surface of the substrate, and, as BMD is spontaneously formed by a thermal processing in the process, the oxygen concentration D in the substrate is made $1.3E18$ atom/$cm^3$ (old ASTM) or higher, and is made $1.5E18$ atom/$cm^3$ (old ASTM) or lower in order to prevent residual defects.

More preferably, a value of $1.4E18$ atom/$cm^3$ (old ASTM) or higher allows to bring the BMD density to a more preferred range.

Conditions of thermal processing may be so selected as to obtain an oxygen concentration as described above.

The polysilicon 20 preferably has a film thickness T of 0.5 µm or more for obtaining a gettering effect, and 2.0 µm or less in consideration of productivity.

The old ASTM means old standards of the American Society for Testing and Materials.

Then a field oxide film 5 is formed on the silicon substrate 3 by an ordinary LOCOS method or a recessed LOCOS method.

After a channel stop layer 6 is formed under the field oxide film 5, a plural-layered P-well is formed by executing ion plantations of four times in the present embodiment with a P-type impurity (such as boron) in succession from the deepest layer with a high energy ion implantation apparatus, and by not executing a high-temperature thermal process such as drive-in thereafter.

The thermal process executed thereafter is at about 950° C. at maximum.

Then, after formation of a polysilicon electrode 7, an N-type charge accumulation area 8 of the photodiode, a P-surface layer 9 and an N-type high concentration layer 10 are formed by ion implantation.

The producing process after a contact hole opening step is same as that in a prior CMOS area sensor and will not, therefore, be explained further.

A PBS formation on a rear surface of the substrate opposite to the pixel area-bearing surface and a defining of thee oxygen concentration in the substrate as in the present embodiment allow to reduce the white dot defects in comparison with a substrate not subjected to such gettering process.

Second Embodiment

The present embodiment is different from the first embodiment in that, in order to further increase BMD by a thermal processing in the production process, a low-temperature thermal process at a temperature H within a range of 450 to 750° C. for 1 hour or longer is added prior to a step of forming a wiring.

Other conditions are same as in the first embodiment.

Third Embodiment

The present embodiment is different from the first embodiment in that an IG process is applied to the PBS substrate thereby positively forming BMD in the substrate. The substrate producing process of the present embodiment will be explained with reference to FIGS. 3A-3F.

Figure 3A:
FIGS. 3A, 3B, 3C, 3D, 3E and 3F are cross sectional views showing a substrate preparation process in a third embodiment of the present invention.

At first an n-type (100) silicon substrate 501 obtained by a CZ (Czochralki) process is prepared (FIG. 3A).

An oxygen concentration in the substrate is preferably 1.4E18 atom/cm$^3$ or higher in order to increase the BMD density.

Figure 3B:
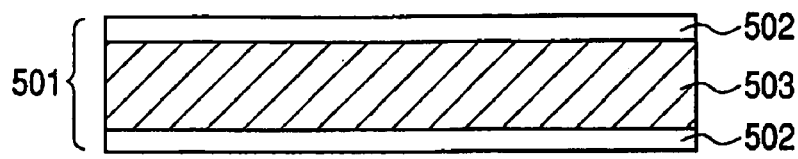

Such substrate 501 is subjected to a mirror polishing on the top surface or on the top and rear surfaces, and is then subjected to a high-temperature thermal process at 1100° C. or higher to externally diffuse oxygen on the substrate surface, thereby forming a denuded zone (DZ) 502 constituting a defect-free area on the substrate surface on which a device is to be formed (FIG. 3B).

Figure 3C:
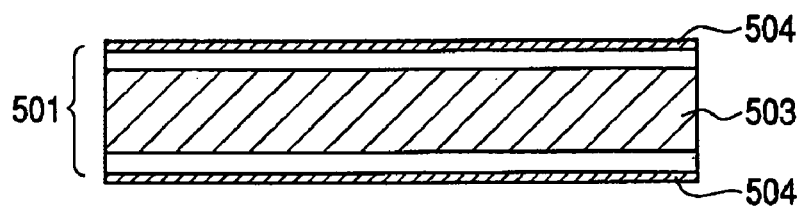
Figure 3D:
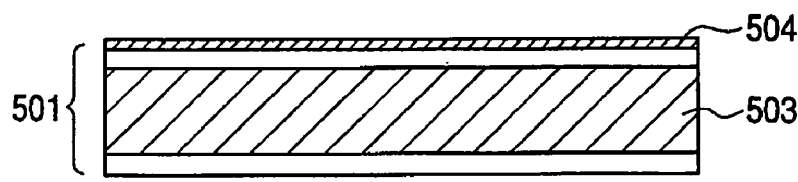

Then a low-temperature thermal process is executed at about 550-650° C. to form oxygen precipitation nuclei in the substrate, and a thermal process is executed at 900° C. or higher to form BMD by such oxygen precipitation nuclei (FIG. 3C).

Thereafter an epitaxial layer maybe or may not be formed, and there is no change in the gettering effect to be obtained.

Then the substrate surfaces are oxidized by several tens of nanometers in an oxygen atmosphere (FIG. 3C), thereby forming silicon oxide films 504 on the top and rear surfaces.

Figure 3E:
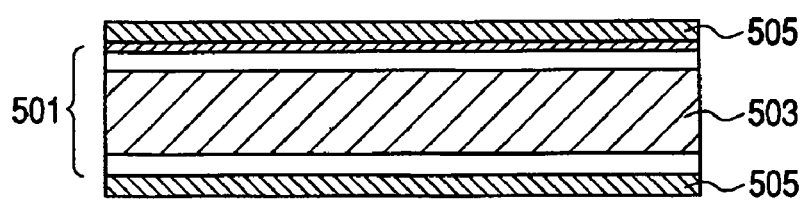

Thereafter, the silicon oxide film 504 on the rear surface is etched off (FIG. 3D), and a polysilicon layers 505 are formed (FIG. 3E).

Such polysilicon layer is to constitute PBS, and preferably has a thickness of 0.5 μm or more in order to obtain a gettering effect and 2.0 μm or less in consideration of the productivity.

Figure 3F:
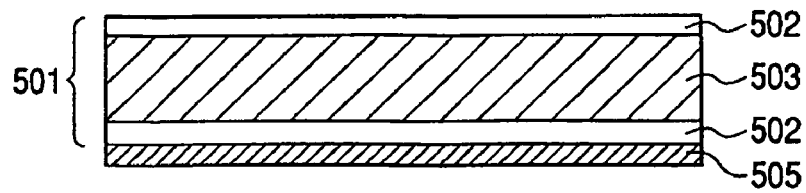

Then the polysilicon layer 505 and the silicon oxide film 504 on the top surface are etched off, thereby obtaining two gettering layers of IG and PBS (FIG. 3F).

The process conditions thereafter are same as in the first and second embodiments.

As explained in the second embodiment, the white dot defects can be further reduced by adding a low-temperature thermal process at 450-750° C. for 1 hour or longer prior to the step of forming a wiring.

Figure 4:
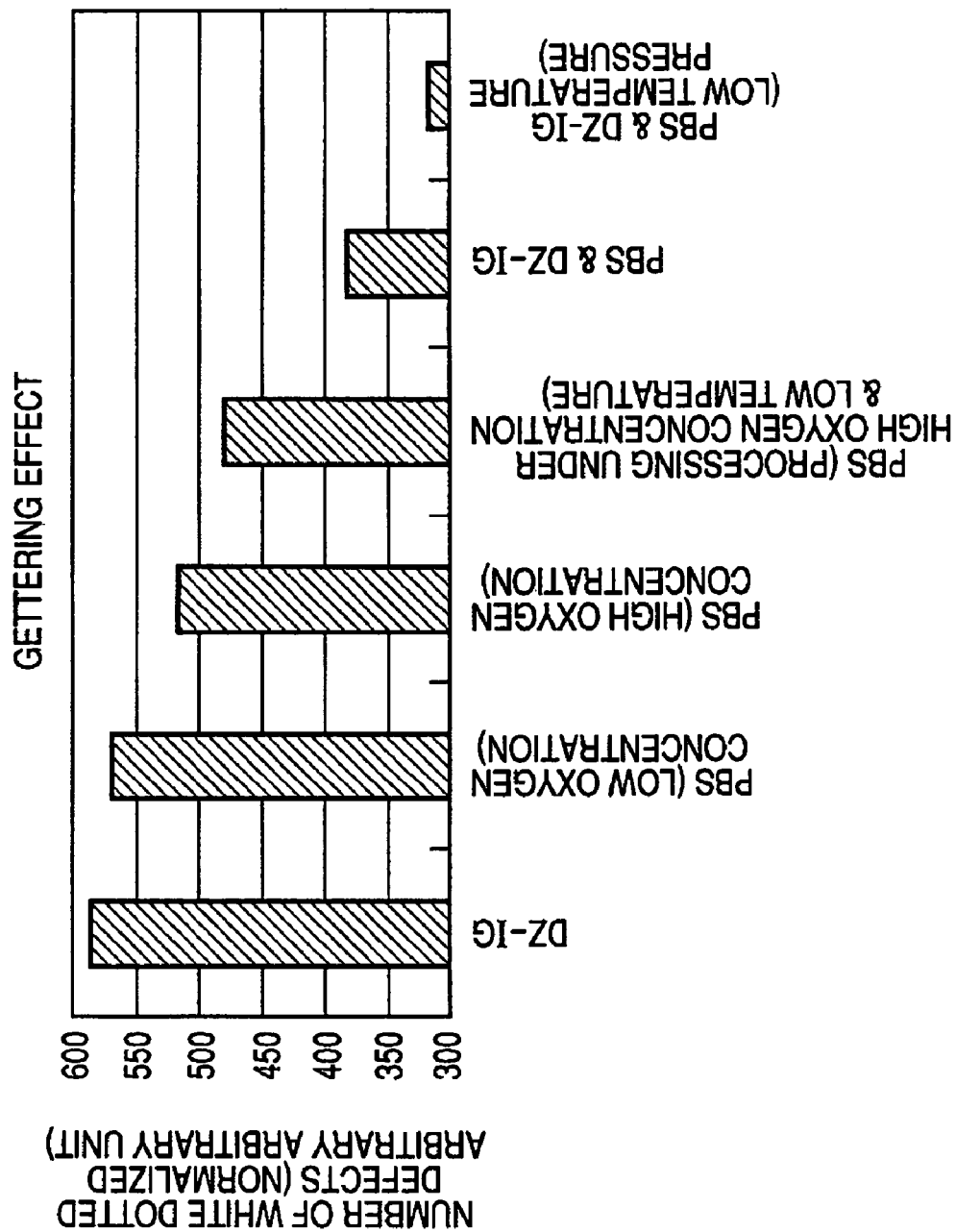
FIG. 4 is a chart showing experimental results on white dot defects in embodiments of the present invention and comparative examples.
Figure 5:
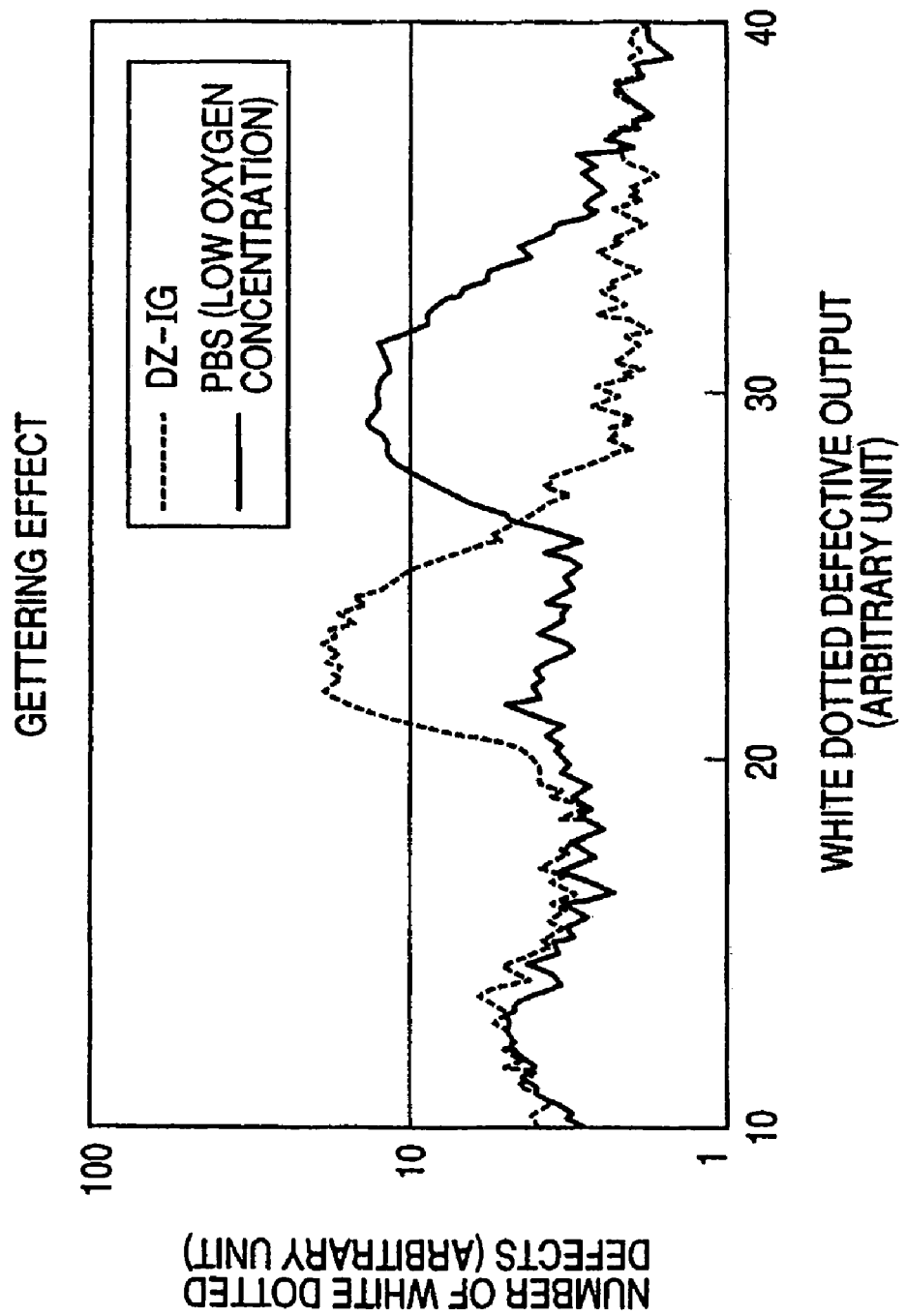
FIG. 5 is a chart showing an effect of a gettering technology.

FIG. 4 is a chart showing experimental results of the foregoing embodiments and comparative examples.

In FIG. 4, DZ-IG indicates an example in which DZ alone is formed by the IG method, and PBS (low oxygen concentration) indicates an example in which PBS is formed on the rear surface of the pixel area-bearing surface, but the oxygen concentration is lower than that specified in the first embodiment. These two constitute comparative examples.

On the other hand, the first embodiment of the present invention has a PBS and specifies the oxygen concentration in the substrate (high oxygen concentration). The second embodiment utilizes a low-temperature process for example in a wiring step (PBS (high oxygen concentration & low-temperature process)). The third embodiment has a PBS and a DZ formed on the substrate top surface by IG method (PBS & DZ-IG), or further has a low-temperature thermal process (PBS & DZ-IG (low-temperature process)). These embodiments of the invention are capable of reducing the white dot defects.

More specifically, the case "PBS (high oxygen concentration)" showed defects reduced by about 10% in comparison with the case "DZ-IG", and the case "PBS (high oxygen concentration & low-temperature process)" showed defects reduced by about 20% in comparison with the case "DZ-IG". Further, the case "PBS & DZ-IG" showed defects reduced by about 40% in comparison with the case "DZ-IG", and the case "PBS & DZ-IG (low-temperature process)" showed defects reduced by about 20% in comparison with the case "DZ-IG".

What is claimed is:

1. A method for manufacturing a semiconductor substrate comprising a pixel area having a plurality of pixels for photoelectric conversion arranged on a front surface of the substrate, the method comprising steps of:

forming a non-defective area in a part of the semiconductor substrate containing an oxygen concentration D within a range of $1.3 \times 10^{18} \leq D \leq 1.5 \times 10^{18}$ atom/cm$^3$ (old ASTM);

forming a bulk micro defect of a density $1 \times 10^5$/cm$^2$ or higher in the semiconductor substrate;

forming a polysilicon film of a thickness T within a range $0.5 \leq T \leq 2.0$ μm on a rear surface of the substrate opposite to the front surface of the substrate on which the pixel area is formed; and conducting a thermal process for 1 hour or longer at a temperature H within a range of $450 \leq H \leq 750°$ C., after the step of forming the polysilicon film and before forming a metal wiring on the semiconductor substrate, wherein the step of forming the non-defective area is conducted before the step of forming the bulk micro defect, and the step of forming the bulk micro defect is conducted before the step of forming the polysilicon film.

2. The method according to claim 1, wherein the step of forming the non-defective area is a high-temperature thermal process at 1100° C. or higher.

3. The method according to claim 1, wherein the step of forming the bulk micro defect comprises two thermal processes.

* * * * *

UNITED STATES PATENT AND TRADEMARK OFFICE
CERTIFICATE OF CORRECTION

PATENT NO. : 7,387,952 B2  Page 1 of 1
APPLICATION NO. : 11/291955
DATED : June 17, 2008
INVENTOR(S) : Shigeru Nishimura et al.

It is certified that error appears in the above-identified patent and that said Letters Patent is hereby corrected as shown below:

Title Page, Item (57)
ABSTRACT:
  Line 6, "1.3-1.5E+18 atom/cm$^3$" should read -- 1.3E18 - 1.5E18 atom/cm$^3$ --.

COLUMN 2:
  Line 65, "constitutes" should read -- constitute --.

COLUMN 5:
  Line 17, "thee" should read -- the --.

Signed and Sealed this

Tenth Day of March, 2009

JOHN DOLL
*Acting Director of the United States Patent and Trademark Office*